US007583162B2

(12) United States Patent
Nagano

(10) Patent No.: US 7,583,162 B2
(45) Date of Patent: Sep. 1, 2009

(54) PIEZOELECTRIC DEVICE AND METHOD FOR MANUFACTURING THE PIEZOELECTRIC DEVICE

(75) Inventor: Youji Nagano, Chigasaki (JP)

(73) Assignee: Epson Toyocom Corporation, Tokyo (JP)

( * ) Notice: Subject to any disclaimer, the term of this patent is extended or adjusted under 35 U.S.C. 154(b) by 203 days.

(21) Appl. No.: 11/522,907

(22) Filed: Sep. 19, 2006

(65) Prior Publication Data

US 2007/0080758 A1    Apr. 12, 2007

(30) Foreign Application Priority Data

Oct. 12, 2005   (JP)   ............................. 2005-298197
Aug. 28, 2006   (JP)   ............................. 2006-230172

(51) Int. Cl.
  *H03H 9/00*  (2006.01)
(52) U.S. Cl. ...................... 333/187; 333/186; 333/193
(58) Field of Classification Search ................. 333/193, 333/187, 186; 310/348; 428/426
See application file for complete search history.

(56) References Cited

U.S. PATENT DOCUMENTS

| 5,962,102 | A  | * | 10/1999 | Sheffield et al. ............... 428/92 |
| 6,556,105 | B1 | * | 4/2003 | Nguyen et al. ............... 333/193 |
| 6,924,429 | B2 |   | 8/2005 | Kasai et al. |
| 7,186,461 | B2 | * | 3/2007 | Rita ........................... 428/426 |
| 7,211,934 | B2 | * | 5/2007 | Fujiwara et al. ............. 310/348 |

FOREIGN PATENT DOCUMENTS

| JP | A 2000-232332 | 8/2000 |
| JP | A 2000-332572 | 11/2000 |
| JP | A 2005-197595 | 7/2005 |
| JP | A 2005-216508 | 8/2005 |
| JP | A 2005-318330 | 11/2005 |

* cited by examiner

*Primary Examiner*—Rexford N Barnie
*Assistant Examiner*—Crystal L Hammond
(74) *Attorney, Agent, or Firm*—Oliff & Berridge, PLC

(57) ABSTRACT

A piezoelectric device includes a piezoelectric substrate having a connection pad, a package having an electrode pad, and a connection member to connect the electrode pad to the connection pad, the connection member being a metal member having a plurality of spherical metal particles connected to each other by sintering.

6 Claims, 5 Drawing Sheets

ENLARGED VIEW OF PORTION B

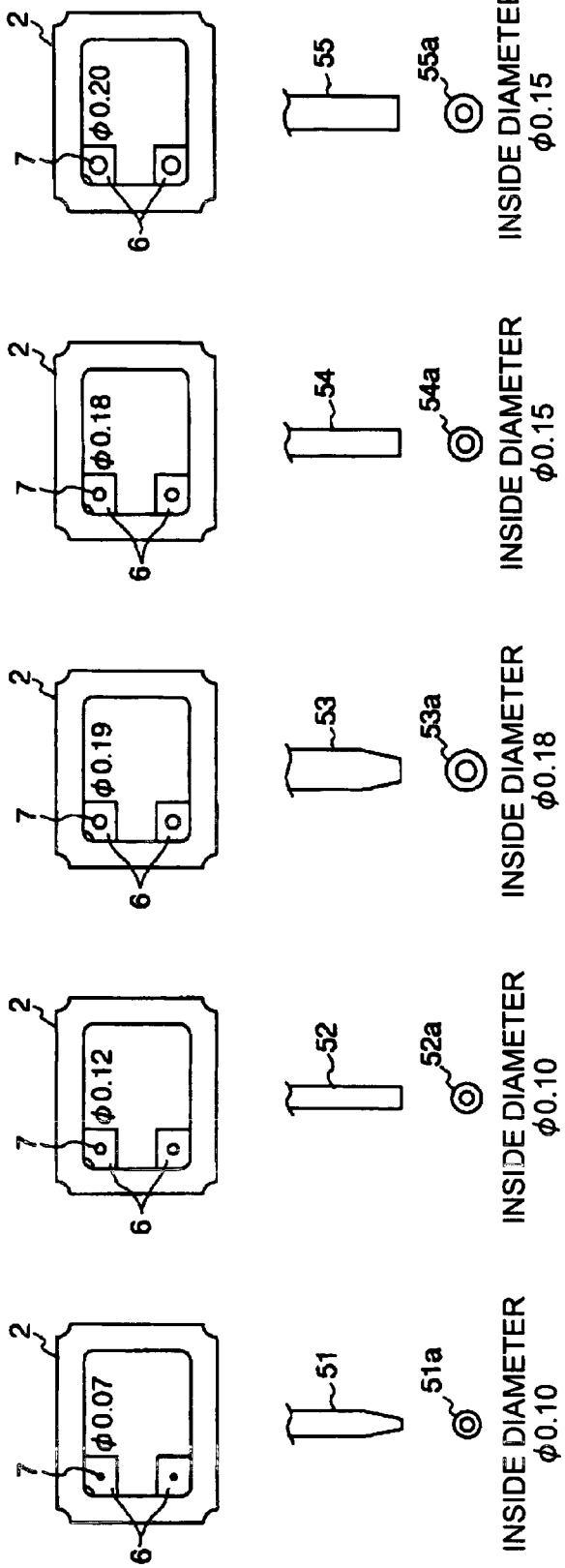

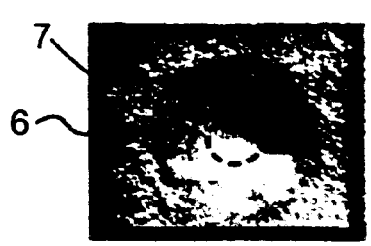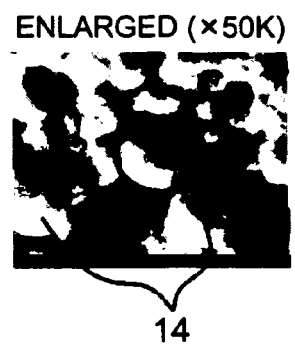
FIG. 3A        FIG. 3B
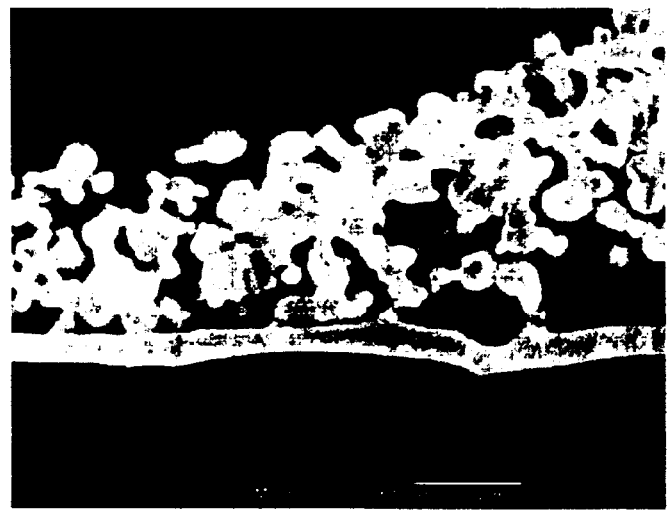
FIG. 4A
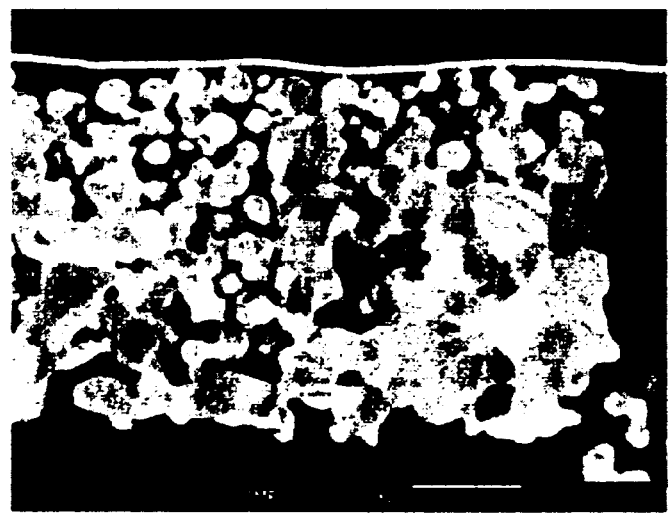
FIG. 4B

| | ADHESIVE A | ADHESIVE B | ADHESIVE C | ADHESIVE D |
|---|---|---|---|---|
| PACKAGE WITH APPLIED ADHESIVE | | | | |
| PORTION X | | | | |
| PORTION Y | | | | |

PIEZOELECTRIC DEVICE AND METHOD FOR MANUFACTURING THE PIEZOELECTRIC DEVICE

BACKGROUND

1. Technical Field

The present invention relates to a surface-mounted piezoelectric resonator and a piezoelectric oscillator and a piezoelectric filter including such a piezoelectric resonator.

2. Related Art

Conventionally, in piezoelectric devices such as a piezoelectric resonator and a piezoelectric oscillator and a piezoelectric filter including a piezoelectric resonator, a connection pad on a piezoelectric resonator element has been jointed (secured) to an electrode pad on a package using an electrically conductive adhesive or a gold bump.

For example, JP-A-2000-332572 discloses a technique relating to a structure of a piezoelectric device which is suitable for wire bonding connection and reduces influence of the electrically conductive adhesive on various characteristics of the piezoelectric resonator.

In addition, JP-A-2000-232332 discloses a surface-mounted piezoelectric resonator that eliminates problems that arise when securing an Au bump formed on an Ag connection pad provided on a quartz crystal resonator to an Au internal terminal within a ceramic package by thermocompression bonding. Examples of such problems include: (a) excessive heating causing internal stress by heat distortion on a quartz blank that forms part of the quartz crystal resonator; (b) oxidation of an Ag layer forming the connection pad causing fluctuation of a resonance frequency; and (c) occurrence of stress inside the quartz blank due to warpage of the package.

JP-A-2000-332572 is a first example of related art.

JP-A-2000-232332 is a second example of related art.

JP-A-2005-216508 is a third example of related art.

The electrically conductive adhesive is composed of organic resin, such as silicone, epoxy, or the like, and silver particles, and curing and shrinking of such organic resin causes the piezoelectric resonator element to adhere to the electrode pad on the package, and reduction in volume of the organic resin brings the silver particles into contact with each other to ensure conductivity therebetween. Conventionally, application of the electrically conductive adhesive has generally been performed using a dispensing method, but with an increasing reduction in size and profile of piezoelectric devices, the sizes (i.e., areas) of electrode pads on packages (substrates) in which the piezoelectric resonator elements are disposed have been reduced. For example, in the case of a 2016 size (i.e., 2 mm×1.6 mm) piezoelectric resonator, the size of an electrode pad is approximately 0.30 mm.×0.30 mm Therefore, considering irregularity when applying the electrically conductive adhesive on the electrode pads, there is currently a need to reduce the size of the electrically conductive adhesive, which has been applied using a dispenser, to $\Phi$0.20 mm or shorter.

A surface-mounted piezoelectric resonator becomes easy to be damaged by mechanical impact, if the piezoelectric resonator element becomes thin along with higher frequencies, for example. In order to absorb a shock of the impact, an electrically conductive adhesive including a silicon resin (an electrically conductive silicon adhesive) is generally used to connect a package and a piezoelectric resonator element.

The constituents of the electrically conductive silicon adhesive are generally 80 to 90 wt % silver particle, 15 to 25 wt % resin, and 5 to 15 wt % solvent. The viscosity is from 200 to 250 dPa·s and the thixotropic ratio is 3.0 to 6.0, commonly.

However, since the electrically conductive adhesive is a paste containing approximately 20 wt % resin, after application of the adhesive, it spreads and overflows out of the electrode pad. In other words, there is a problem in that it is impossible to successfully apply the adhesive so as to have a sufficiently small diameter.

FIG. 6 illustrates various electrically conductive adhesives A, B, C, and D applied on electrode pads on a package using the dispensing method. As shown in FIG. 6, each of the electrically conductive adhesives A, B, C, and D spreads after application on the electrode pads, so that the size thereof is not restricted to $\Phi$0.20 mm or shorter.

When the adhesive is applied so as to have a diameter of 0.20 mm, a needle having an inside diameter of approximately 0.10 mm is employed, but this involves a problem in that an ejection path in the needle is clogged with the silver particles, making successive application of the adhesive impossible.

Moreover, the electrically conductive adhesive gives off an organic matter (gas) by being heated even after being cured. If the gas is condensed to defile a blank surface of the piezoelectric resonator element, a change of frequency occurs.

Particularly in recent years, when the reduction in size and profile of the piezoelectric devices has reduced the volume of a space in which the piezoelectric resonator element is contained, the piezoelectric devices have a structure that permits such gas to exert a striking influence, resulting in failure to achieve desired characteristics.

In short, the recent reduction in size and profile of the piezoelectric devices has made it difficult to accomplish adhesion of the piezoelectric resonator element by application of the electrically conductive adhesive using the dispensing method such that the applied adhesive has a sufficiently small diameter. In addition, there is a problem in that generation of the organic matter (gas) causes failure to achieve desired characteristics.

Accordingly, as disclosed in the second example of related art, a method has been proposed of achieving joining of the piezoelectric resonator element using a gold bump made of a beaten gold wire instead of the electrically conductive adhesive.

FIG. 7 illustrates an exemplary joining method for the piezoelectric resonator element using the gold bump. In the joining method as illustrated in this figure, while stage-heating is performed by a hot plate 110, a gold bump 103 is disposed to stand on an electrode pad 102 on an inner bottom surface 101 of a package 100, and pressure is exercised by a tool 111 from above upon a piezoelectric resonator element 104 with a required load, so that the piezoelectric resonator element 104 is joined to the electrode pad 102.

In this case, since the gold bump 103 is made of a relatively hard material having a high density and Young's modulus, deformation occurs at a joining point of the piezoelectric resonator element 104. As such, a heat treatment of heating the package 100 has been performed to eliminate the deformation. However, there is a problem of a considerable change in frequency and crystal impedance caused by the heat treatment, resulting in failure to achieve desired characteristics.

On the other hand, as disclosed in the third example of related art, a method of using a metal powder as a metal bump to form a soft bump has been proposed.

However, the metal bump disclosed in the third example of related art joins joining portions after drying and sintering a metal paste to form a metal bump.

When the piezoelectric resonator element 104 that is not to be joined is pressed to the metal bump described the above, the metal bump is crushed and has a structure equal to the gold bump disclosed in the second example of related art.

Therefore, even when the metal bump disclosed in the third example of related art is used, deformation at a joining point of the piezoelectric resonator element 104 may be unavoidable in some cases because the density and Young's modulus of the metal bump are high after the piezoelectric resonator element is mounted.

Further, the metal bump disclosed in the third example of related art is made by dispersing a solvent to dry before the joining portions are joined.

Therefore, even if an end part of the piezoelectric resonator element 104 is mounted on the metal paste so that the piezoelectric resonator element 104 is secured on the metal bump by being held at one side, the metal paste cannot serve sufficient adhesive strength (wettablity) to hold the piezoelectric resonator element 104 in a horizontal position.

Accordingly, before the metal paste is sintered, the free side of the piezoelectric resonator element 104 inclines toward the bottom of the package to contact. This process may give a quartz crystal resonator insufficient resonating characteristics.

SUMMARY

An advantage of the invention is to provide a piezoelectric resonator, a piezoelectric oscillator, and a piezoelectric filter which are capable of achieving desired characteristics while small-diameter application, which has been impracticable with the technique of employing the electrically conductive adhesive, is possible, and the problem of deformation, which has occurred with the technique of employing the gold bump for securing, is eliminated.

A piezoelectric device according to a first aspect of the invention includes a piezoelectric substrate having a connection pad, a package having an electrode pad, and a connection member to connect the electrode pad to the connection pad, wherein the connection member is a metal member in which a plurality of spherical metal particles are connected to each other by sintering.

In the piezoelectric device according to the first aspect of the invention, that the plurality of spherical metal particles may be gold particles, and the metal member may have a porous structure.

In the piezoelectric device according to the first aspect of the invention, it is preferable that a particle diameter of the plurality of spherical metal particles be within a range from 0.2 μm to 0.5 μm.

A method for manufacturing a piezoelectric device according to a second aspect of the invention includes: preparing a piezoelectric substrate having a connection pad; preparing a package having an electrode pad; applying a connection member having a plurality of spherical metal particles and a solvent on the electrode pad; mounting the piezoelectric substrate on the connection member; and sintering and connecting the plurality of spherical metal particles each other.

In the method for manufacturing a piezoelectric device according to the second aspect of the invention, it is preferable that a heating temperature for sintering be within a range from 200 to 300 degrees centigrade.

In the method for manufacturing a piezoelectric device according to the second aspect of the invention, it is preferable that a particle diameter of the plurality of spherical metal particles be within a range from 0.2 82 m to 0.5 μm.

According to the invention, employing the metal member composed of the spherical metal particles and a solvent to connect two electrode pads to the connection pad on a piezoelectric resonator element enables small-diameter application, which has been impracticable with the technique of employing the electrically conductive adhesive, and eliminates the problem of deformation, which has occurred with the technique of employing the gold bump made of a beaten gold wire for connection, making it possible to obtain desired characteristics.

BRIEF DESCRIPTION OF THE DRAWINGS

The invention will now be described with reference to the accompanying drawings, wherein like numbers reference like elements.

FIGS. 2A, 2B, 2C, 2D, and 2E illustrate situations where metal members have been applied on electrode pads using dispensers.

FIGS. 3A and 3B are detailed images of the metal members that have undergone sintering.

FIG. 4A is an image showing in detail an interface between the metal member and a gold plating on the electrode pad.

FIG. 4B is an image showing in detail an interface between the metal member and an gold sputtered film on a piezoelectric resonator element.

DESCRIPTION OF EXEMPLARY EMBODIMENTS

Embodiments of the invention will now be described with reference to the drawings.

Figure 1A:
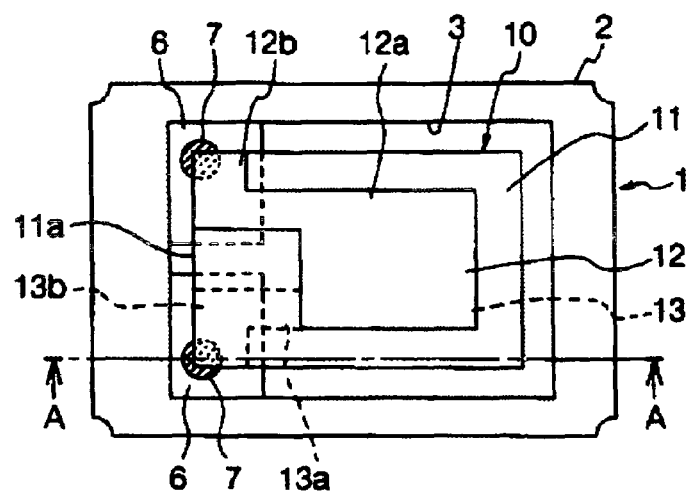
FIGS. 1A, 1B, and 1C illustrate a structure of a piezoelectric resonator according to one embodiment of the invention.
Figure 1B:
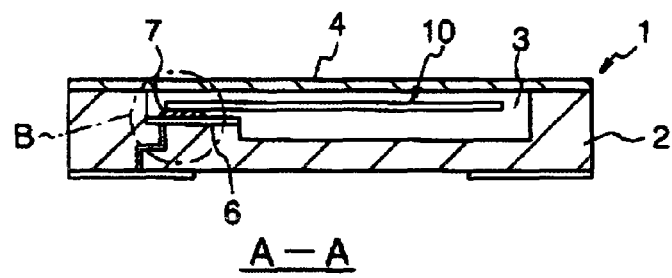
Figure 1C:
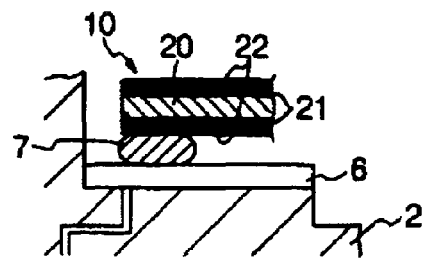

FIGS. 1A, 1B, and 1C illustrate a structure of a piezoelectric resonator according to one embodiment of the invention. Specifically, FIG. 1A is a plan view thereof illustrating an internal structure thereof, FIG. 1B is a longitudinal section thereof as viewed from the direction indicated by arrows A illustrated in FIG. 1A, and FIG. 1C is an enlarged view of a portion enclosed by a dashed line circle B illustrated in FIG. 1B.

A piezoelectric resonator 1 illustrated in FIG. 1A and FIG. 1B has a structure in which a piezoelectric resonator element 10 is housed within a recessed portion 3 of a package 2 for surface mounting and thereafter the recessed portion 3 is sealed by a metal lid 4.

The package 2 includes a mounting terminal used for surface mounting provided on an outer bottom surface of an insulating substrate made of an insulating material such as ceramic. The package 2 also includes two electrode pads 6 arranged adjacent to each other which are provided on an inner bottom surface of the recessed portion 3 and to which the piezoelectric resonator element 10 is electrically and mechanically connected by using a metal member 7, which is a connection member characteristic of the invention. The metal member 7 will be described in detail later.

The piezoelectric resonator element 10 includes a piezoelectric substrate 11 such as a quartz substrate, excitation electrodes 12 and 13 formed on different principal surfaces of the piezoelectric substrate 11, lead terminals 12a and 13a extending respectively from the excitation electrodes 12 and 13 toward one edge 11a of the piezoelectric substrate 11, and connection pads 12b and 13b connected respectively to edges of the lead terminals 12a and 13a.

The lead terminal 12a extending from the excitation electrode 12 formed on one surface of the piezoelectric substrate 11 has an electrical connection with the connection pad 12b formed on the same surface of the piezoelectric substrate. The lead terminal 13a extending from the excitation electrode 13 formed on the opposite surface of the piezoelectric substrate 11 has an electrical connection with the connection pad 13b formed along the edge 11a of the former surface. Therefore, the two connection pads 12b and 13b are arranged adjacent to each other along the edge 11a of one surface of the piezoelectric substrate 11. Moreover, the connection pads 12b and 13b are arranged so as to maintain relative positions that allow them to correspond uniquely to the electrode pads 6 on the package.

At this time, the thickness of a blank (i.e., the thickness of the piezoelectric substrate 11) of the piezoelectric resonator element 10 is approximately 35 μm, and as illustrated in FIG. 1C, the connection pads 13b and 12b formed on both surfaces of a blank 20 (i.e., the piezoelectric substrate 11) of the piezoelectric resonator element 10 are formed by forming a nickel (Ni) sputtered film 21 having a thickness of approximately 150 Å on the blank 20 and further forming a gold (Au) sputtered film 22 having a thickness of approximately 850 Å on the Ni sputtered film 21. Although not shown in the figures, each of the electrode pads 6 is, for example, formed by applying an Ni plating having a thickness of approximately 4 μm to metallized tungsten having a thickness of approximately 10 μm formed on the inner bottom surface of the package 2 and further applying an Au plating having a thickness of approximately 0.5 μm over the Ni plating.

A characteristic feature of the piezoelectric resonator 1 thus constructed is that the metal member 7 having a porous structure is employed as the connection member for connecting the two electrode pads 6 provided on the inner bottom surface of the package 2 to the two connection pads 12b and 13b on the piezoelectric resonator element 10, the metal member 7 containing a plurality of spherical metal particles. This enables the small-diameter application of the connection member, which has been impracticable with the conventional technique of employing the electrically conductive adhesive, and moreover, because the metal member 7 has a porous structure, the deformation, occurrence of which has been a drawback of the technique of employing the gold bump for securing, does not occur, so that desired characteristics can be obtained.

Alternatively, as a base of the gold sputtered film 22, chromium may be used instead of the Ni sputtered film 21. Further, silver can also be used instead of the gold sputtered film 22. Furthermore, as referred to the above, the embodiment according to the invention has been described by a method to form a metal film such as the connection pads 13b and 12b by sputtering. However, the piezoelectric resonator element 10 can be formed with a metal film by vapor deposition or plating.

FIGS. 2A to 2E illustrate situations where the metal members 7 have been applied, using dispensers, on the electrode pads 6 within the package 2 in which the piezoelectric resonator element 10 is housed.

As illustrated in the figures, when there is a desire to apply the metal member 7 using a dispenser such that the resulting metal member will have a small diameter of 0.20 mm or shorter, for example, it has been found that if needles 53 and 54 having an inside diameter of 0.18 mm and 0.15 mm as illustrated in FIGS. 2C and 2D (30G straight needles produced by Musashi Engneering, Inc. or EFD, Inc.) are employed, the resulting metal member 7 applied on the electrode pads 6 will have a diameter of 0.18 mm to 0.20 mm.

When there is a desire to apply the metal member 7 such that the resulting metal member will have a smaller diameter of 0.15 mm or shorter, for example, it has been found that if a needle 52 having an inside diameter of 0.10 mm as illustrated in FIG. 2B (a Mikros pen type 32G straight needle produced by EFD, Inc.) is employed, the resulting metal member 7 applied on the electrode pads 6 will have a diameter of 0.12 mm. Further, it has been found that if a needle 51 with an outside diameter of its tip being reduced by grinding as illustrated in FIG. 2A (a 33G chamfer needle having an inside diameter of 0.10 mm produced by EFD, Inc.) is employed, the resulting metal member 7 applied on the electrode pads 6 will have a diameter of 0.07 mm.

Further, it has been found that if a needle 55 having an inside diameter of 0.15 mm as illustrated in FIG. 2E (a 30G straight needle produced by Musashi Engneering, Inc.) is employed to apply the metal member 7, the resulting metal member 7 applied on the electrode pads 6 will have a diameter of 0.18 mm to 0.20 mm.

In addition, the metal member 7 used in the dispensing processes such as above contains 90 wt % metal particle, 9 wt % solvent, and 1 wt % resin. Each of spherical metal particles has a particle diameter with in a range from 0.01 μm to 0.9 μm. The temperature of sintering is from 200 to 300 degrees centigrade.

Further, for the metal member 7, using a material that does not contain a covering solvent that may cover the surface of the metal particles or a substance that may react with a covering solvent is preferable to make the density of the metal particles higher according to an application amount for ensuring high conductivity.

When metal particles having a particle diameter that is relatively small such as from 0.01 μm to 0.1 μm are used, advantageous effects such as lowering the sintering temperature and preventing an accident in which an ejection hole of the dispenser is clogged because the thixotropic ratio of the metal member before sintering can be kept low are obtained.

However, in this case, it becomes hard to obtain a porous structure as sintering between the metal particles occurs easily and the metal density of the metal member 7 becomes too high, resulting in the metal density of the metal member 7 and Young's modulus are close to those of the metal bump (i.g. bonding ball).

On the other hand, because the sintering temperature needs to be higher if the particle diameter of the metal particle is larger, the damage to the piezoelectic resonator element becomes also larger.

Furthermore, when the particle diameter is larger, the metal member 7 can easily transmit an impact from outside such as a drop impact. In addition, the metal density and Young's modulus of the porous structure become partially high.

Therefore, in order to realize a porous structure stably with the metal density and Young's modulus that are relatively low, it is preferable that the metal member 7 be composed of metal particles having a particle diameter of 0.20 μm to 0.50 μm.

Additionally, in the case of the Au bump, the Young's modulus is about 78 Gpa. However, the Young's modulus of the metal member according to the embodiment is from 9 Gpa to 16 Gpa, which is smaller than that of the Au bump.

Incidentally, when the conventional electrically conductive adhesive was applied using the needle 55 as illustrated in FIG. 2E, the resulting applied adhesive had an average diameter of 0.28 mm (variations ranging from 0.24 mm to 0.32 mm).

As described above, in the present embodiment, the use of the metal member 7 composed of the spherical metal particles and a solvent as the connection member for electrically and mechanically connecting the piezoelectric resonator element 10 to the electrode pads 6 enables the small-diameter application using a dispenser, which has been impracticable with the technique of employing the electrically conductive adhesive.

Next, after the application of the metal member 7 on the electrode pads 6 in the above-described manner, the piezoelectric resonator element 10 is mounted on the metal member 7 and a heat treatment at a temperature of 300 degrees centigrade or lower (200 to 300 degrees centigrade) is performed in a clean oven, for example. Then, the solvent contained in the metal member 7 is volatilized and the metal particles are sintered, whereby the piezoelectric resonator element 10 is connected to the electrode pads 6.

In a case where the heating temperature of the clean oven is set at 200 degrees centigrade or lower, the possibility of incomplete sintering between the spherical metal particles is high. Further, in a case where the heating temperature is set at 300 degrees centigrade or higher, the spherical metal particles are overmelted and this makes hard to obtain a porous structure.

On the other hand, when a particle diameter of the spherical metal particles is from 0.2 μm to 0.5 μm, it is desirable that the heat treatment be performed by setting the temperature in the clean oven to from 225 to 275 degrees centigrade.

FIG. 3A is an image of the metal member 7 on the electrode pads 6 prior to the mounting of a quartz crystal resonator element, and FIG. 3B is an enlarged image showing the metal member 7 as shown in FIG. 3A after undergoing sintering.

From FIG. 3B, it is apparent that surfaces of spherical metal particles 14 contained in the metal member 7 have undergone sintering and they have been connected to one another to form a three-dimensional porous structure.

FIG. 4A is an enlarged image showing an interface between the metal member 7 and the gold plating on the electrode pads 6, and FIG. 4B is an enlarged image showing an interface between the metal member 7 and the gold sputtered film 22 on the piezoelectric resonator element 10.

In the case where gold particles are used as the spherical metal particles in the metal member 7, the spherical metal particles 14 in the metal member 7 fuse with the gold sputtered film 22 formed on the piezoelectric resonator element 10 as illustrated in FIG. 4B while at the same time they fuse with a gold plating 15 formed on the electrode pads 6 within the package 2 in which the piezoelectric resonator element 10 is housed, as illustrated in FIG. 4A. In short, the piezoelectric resonator element 10 and the electrode pads 6 on the package 2 are electrically connected to each other and at the same time securely joined to each other by metallic bond.

Here, it is obvious that the three-dimensional porous structure in which the gold particles in the metal member 7 are sintered involves a lower density than that of the gold bump. Having the porous structure, the metal member 7 has a low Young's modulus and thus is capable of attenuating the stress at the connection point. This is because, although the same material, gold, is used for the metal member 7 and the gold bump, the sintered body of the metal member 7 forms a porous structure, resulting in a different density of the sintered body and difference in Young's modulus.

Pure gold has a density of 19.3 g/cm$^3$ and a Young's modulus of 78 Gpa. In contrast, the metal member 7 after sintering at 230 degrees centigrade for one hour has a density of 15.8 g/cm$^3$ and a Young's modulus of 9.5 Gpa. That is, the density and the Young's modulus of the metal member 7 after sintering at 230 degrees centigrade for one hour are, respectively, approximately 82% and approximately 12% of those of the pure gold.

Therefore, as in the embodiment, if the metal member 7 that is composed of the spherical metal particles 14 and the solvent and forms a porous structure after sintering is used for electrical and mechanical connection between the electrode pads 6 and the piezoelectric resonator element 10, the occurrence of deformation, which has been a problem, for example, with the technique of employing the gold bump as the connection member, is prevented and desired characteristics can be obtained.

Note that in the embodiment, the metal member 7 is applied on the electrode pads 6 using a dispenser and the piezoelectric resonator element 10 is mounted thereon, and thereafter the heat treatment is performed for securing. However, this is simply one example. Another conceivable method is to form a columnar structure in a paste form on the piezoelectric resonator element 10 or on a surface of the electrode pads 6 on the package 2 in which the piezoelectric resonator element 10 is housed by using a dispenser or other methods, then perform a heat treatment to form a columnar bump therefrom, and press the piezoelectric resonator element 10 to the columnar bump during a heat application using ultrasonic waves at the same time or without using ultrasonic waves in order to establish connection.

In this case, for example, by using spherical metal particles having a particle diameter of 0.5 μm to 0.9 μm, which is rather large, it is less likely to happen that the porous structure is completely crushed by pressing when the columnar bump is pressed by the piezoelectric resonator element 10 because of high rigidity of the spherical metal particles.

Figure 5A:
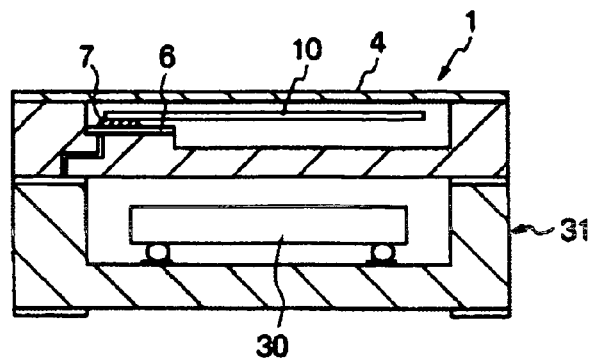
FIGS. 5A, 5B, and 5C illustrate structures of piezoelectric oscillators according to the embodiment of the invention.
Figure 5B:
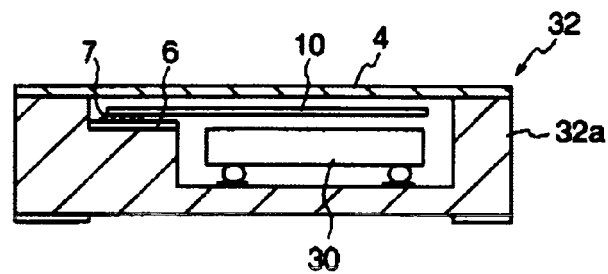
Figure 5C:
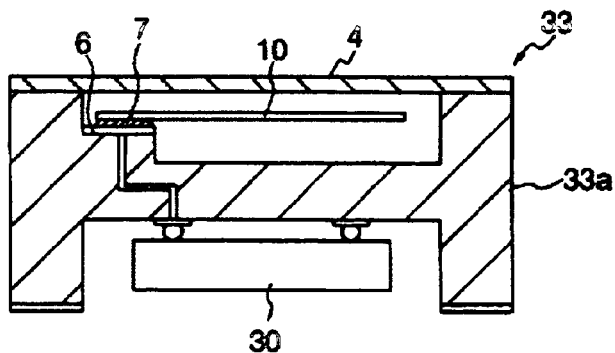
Figures 6, 7:
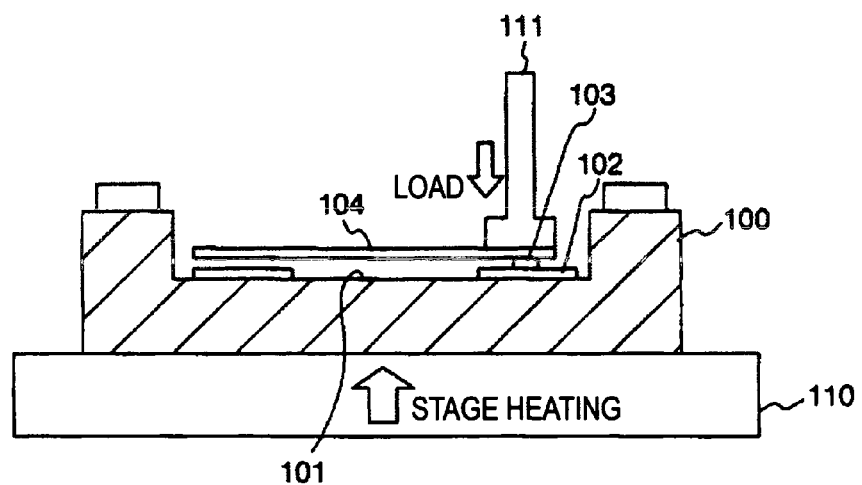
FIG. 6 illustrates examples of application of various electrically conductive adhesives using a dispensing method.
FIG. 7 illustrates an exemplary method of using a gold bump to secure the piezoelectric resonator element.

Also note that in the embodiment, the piezoelectric resonator has been described as an example. However, this is simply an example. For example, although not shown in the figures, the metal member composed of the spherical metal particles and the solvent may be used as the connection member in a piezoelectric filter in which two connection pads on a piezoelectric resonator element are connected to and supported by two electrode pads provided within a recessed portion of a surface-mount package using the connection member and the recessed portion is hermetically sealed by a lid. Moreover, it is also possible to construct a piezoelectric oscillator having a so-called two-storied structure by combining the piezoelectric resonator 1 according to the embodiment and an oscillator circuit 31 containing an IC component 30, as illustrated in FIG. 5A; a piezoelectric oscillator 32 having a single seal structure and having the piezoelectric resonator element 10 and the IC component 30 contained in the same package 32a, as illustrated in FIG. 5B; and a piezoelectric oscillator 33 involving use of an H-shaped package 33a, as illustrated in FIG. 5C.

What is claimed is:

1. A piezoelectric device, comprising:
   a piezoelectric substrate having a connection pad;
   a package having an electrode pad; and
   a connection member to connect the electrode pad to the connection pad, the connection member being a metal member having a plurality of spherical metal particles connected to each other by sintering,
   wherein the metal member has a porous structure, the porosity is created by an evaporated solvent.

2. The piezoelectric device according to claim 1, wherein the plurality of spherical metal particles are gold particles.

3. The piezoelectric device according to claim 1, wherein a particle diameter of the plurality of spherical metal particles is within a range from 0.2 μm to 0.5 μm.

4. A method for manufacturing a piezoelectric device, comprising:

preparing a piezoelectric substrate having a connection pad;

preparing a package having an electrode pad;

applying a connection member having a plurality of spherical metal particles and a solvent on the electrode pad;

mounting the piezoelectric substrate on the connection member; and sintering and combining the plurality of spherical metal particles each other, wherein the sintered and combined plurality of spherical metal particles have a porous structure, the step of sintering including evaporating a solvent to create the porosity.

5. The method for manufacturing a piezoelectric device according to claim 4, wherein a heating temperature for sintering is within a range from 200 to 300 degrees centigrade.

6. The method for manufacturing a piezoelectric device according to claim 4, wherein a particle diameter of the plurality of spherical metal particles is within a range from 0.2 μm to 0.5 μm.

* * * * *